United States Patent [19]

Chatterjee

[11] Patent Number: 4,695,872

[45] Date of Patent: Sep. 22, 1987

[54] HIGH DENSITY MICROPACKAGE FOR IC CHIPS

[75] Inventor: Pallab K. Chatterjee, Dallas, Tex.

[73] Assignee: Texas Instruments Incorporated, Dallas, Tex.

[21] Appl. No.: 892,224

[22] Filed: Aug. 1, 1986

[51] Int. Cl.⁴ ............................................. H01L 23/16
[52] U.S. Cl. ........................................ 357/75; 357/74; 357/71; 357/80; 357/55
[58] Field of Search ................... 357/74, 80, 71, 75, 357/55

[56] References Cited

U.S. PATENT DOCUMENTS 4,264,917 4/1981 Ugon ..................................... 357/80
4,616,655 10/1986 Weinberg et al. ..................... 357/80

Primary Examiner—Martin H. Edlow
Assistant Examiner—G. Key
Attorney, Agent, or Firm—Douglas A. Sorensen; Leo N. Heiting; Mel Sharp

[57] ABSTRACT

A micropackage for providing high density, three dimensional packaging of integrated circuit chips. A chipmount (10) includes a plurality of channels (36) on the bottom surface thereof for holding a corresponding plurality of integrated circuit chips (16). A shallow cavity (34) is formed on the top surface of the chipmount (10) for holding another integrated circuit (14). Metallization interconnections (22) are formed on the top and bottom surfaces of the chipmount (10) and are terminated by solder pads (24, 39). Conductive conduits (26) are formed through the chipmount (10) for providing electrical continuity between an integrated circuit chip (14) mounted on the top side, to other integrated circuit chips (16) mounted on the bottom side of the chipmount. Other conductive conduits (30, 32) and a bridging member (28) insulates intersecting conductive paths (48, 50). The micropackage is fabricated with standard silicon technology.

19 Claims, 10 Drawing Figures

HIGH DENSITY MICROPACKAGE FOR IC CHIPS

RELATED APPLICATION

"Baseboard for Orthogonal Chip Mount", by Kenneth E. Bean and Satwinder Malhi, filed Aug. 1, 1986, Ser. No. 893,770.

TECHNICAL FIELD OF THE INVENTION

The present invention relates in general to electronic circuit packaging methods and apparatus, and more particularly relates to methods and apparatus for packing multiple high speed integrated circuit chips in a compact volume.

BACKGROUND OF THE INVENTION

There is a constant endeavor to increase the speed by which integrated circuits can process digital information. By increasing the speed of integrated circuits, more information can be processed per unit time. The importance of high speed integrated circuit is evident, especially with digital integrated circuits, where successive generations of circuits have achieved faster switching speeds and lower propagation delays from the input to the output.

While new techniques are continually being developed to improve the speed characteristics of integrated circuits, little is being done to collectively preserve the high speed nature of a number of integrated circuits connected together on a circuit module to provide an overall function. Even though an integrated circuit may have internal high speed characteristics, such characteristics may not be fully realized when interconnected with other integrated circuits.

One approach for combining the functions of various integrated circuits is to provide a phenolic or fiberglass printed wire board, or printed circuit board, on which a number of integrated circuits may be mounted. Dual in-like or flat package integrated circuit chip carriers can be soldered or inserted into sockets in the printed wire boards. Such printed wire boards are constructed using metallic conductive paths for interconnecting the inputs and outputs of the various integrated circuits together to provide a desired function. The printed wire boards may even be connected to a printed wire backplane, so as to electrically combine other similar printed wire boards. This arrangement is typically utilized in building electrical apparatus, such as computers, minicomputers and a host of other electrical systems.

The packing density by which integrated circuits can be mounted to such printed wire boards is determined primarily by the size of the integrated circuit. As more circuitry is required, the printed wire boards become successively larger, and thus the distance between certain ones of the integrated circuits becomes greater. In high speed date processing equipment, the spacing between integrated circuits becomes critical, in that such spacing is proportional to the time by which signals can be transferred between the integrated circuits. As the interconnecting paths between integrated circuits becomes greater, the distributed capacitance associated with such path also increases, thereby adding to the time which it takes for a signal to propagate from one integrated circuit to another. Therefore, unless particular precautions are taken in packaging multiple integrated circuits, the individual high speed characteristics thereof may not be fully realized.

A microprocessor integrated circuit operating in conjunction with a number of integrated circuit memories is illustrative of the above-noted problem. Present microprocessor integrated circuits are capable of high speed exchanges of data between the memories to perform a task according to a software program. With the constant exchange of information between the microprocessor and the associated memories, it is imperative that the speed characteristics of the integrated circuits not be compromised by the manner in which the circuits are connected together. Optimum performance of the microprocessor requires that it be connected as closely as possible to the circuits most often accessed, namely the memories. In the ordinary course of operation, microprocessors can exchange millions of bits of data information per second with the associated memories. Any delay in exchanging data between the microprocessor and the memory is cumulative, and thus is a significant factor to consider in the design of a microprocessor controlled system.

From the foregoing, it can be seen that a need exists for an improved method and apparatus for packaging high speed integrated circuits, such as microprocessors and companion memories. A need also exists for packaging plural integrated circuit chips together, rather than the dual in-line of flat package carriers which typically contain the chips. An associated need exists for the construction of a high density package which is compatible with the manufacture of the integrated circuit chips themselves.

SUMMARY OF THE INVENTION

In accordance with the present invention, a micropackage is disclosed for physically and electrically joining multiple integrated circuits into a very compact volume. Packing space is conserved and the operational speed of the integrated circuits is preserved.

In the preferred embodiment of the invention, the chipmount of the micropackage is constructed of a doped silicon, orientation etched to form a number of channels in one planar face thereof. A corresponding number of chips, such as high speed memory devices, are inserted into the channels and are thus fixed orthogonally to the chipmount. On an opposing planar face of the chipmount a shallow cavity, the size of an integrated circuit chip laid flat, is etched to hold such chip. A microprocessor chip can be placed in the cavity. With this compact, three dimensional packaging arrangement, a microprocessor and six megabits of memory take up no more than about 1.5 cubic centimeters of space Adjacent each etched channel are formed a plurality of solder pads to provide electrical connections to the memory chips. Plural solder pads are also provided adjacent the shallow cavity to provide electrical connections to the microprocessor chip. A solder bond between the memory chip pads and the chipmount pads provides both an electrical path and a mechanical bond for fixing the memory chips orthogonally to the chipmount. To provide electrical connections between the microprocessor chip and the memory chips, conductive conduits are formed through the chipmount. Electrical interconnections formed under an insulation layer of the chipmount surface connect ones of the memory solder pads to the microprocessor solder pads through the intermediate conductive conduits. The interconnections extend throughout the chipmount to form common connections to all the memory chips, such as used for address and data buses. Additional conductive conduits are formed through the chipmount, and shorted together on one side thereof to form crossovers to provide insulated intersections where the interconnections cross. The microprocessor chip is fixed to the chipmount by a suitable cement or epoxy.

A flexible member with conductive paths can form a part of the micropackage for connecting the microprocessor chip to its associated chipmount solder pads, as well as providing external connections for electrical access to the micropackage. The conductive paths of the flexible member are electrically bonded to the micropackage by heating the solder connections to a point near melting, and then applying pressure to compressively fuse the metallic connections together.

The chipmount is fabricated using conventional silicon technology. A doped silicon wafer is masked, patterned and subjected to an orientation dependent etch to form the parallel channels and the shallow cavity. The conduits extending through the silicon chipmount are formed with a laser. The conduits are filled with tungsten by a conventional chemical vapor deposition process. Subsequent mask, pattern and metallization steps are used to provide the conductive interconnections over the top and bottom faces of the chipmount. Aluminum sputtered or otherwise deposited on the chipmount provides the metallic conductive medium for the interconnections. A layer of insulation material covering the surfaces of the chipmount provides electrical isolation and a physical protective cover.

The area surrounding the memory chips may be encapsulated to provide structural integrity to the micropackage. The top surface of the chipmount is exposed, thereby enabling bonding of the flexible strip to the topside solder pads.

BRIEF DESCRIPTION OF THE DRAWINGS

Further features and advantages will become more apparent from the following and more particular description of the preferred embodiment of the invention, as illustrated in the accompanying drawings in which like reference characters refer to the same parts throughout the views, and in which.

DETAILED DESCRIPTION OF THE INVENTION

Figure 1:
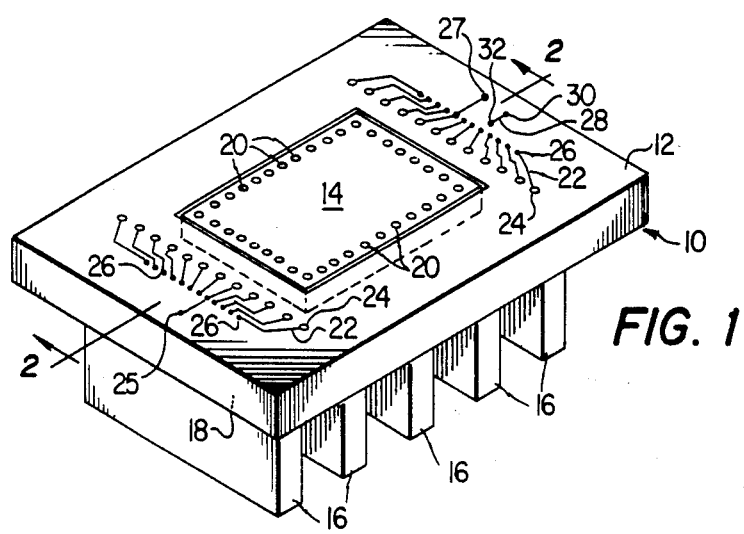
FIG. 1 is an isometric view of a micropackage chipmount for mounting an integrated circuit on one side thereof, and plural integrated circuits on the other side thereof.

The application of the invention is best understood by referring first to FIG. 1 of the drawings. A chipmount 10 forms the basis for the compact package of the micropackage. Attached to one planar face 12 of the chipmount 10 is a microprocessor integrated circuit chip 14. A plurality of memory integrated circuit chips 16 are orthogonally mounted to the other planar face 18 of the chipmount 10. It should be understood at the outset that while the preferred embodiment of the invention is described in terms of a microprocessor 14 and its associated memories 16, other integrated circuit devices can be used instead.

When using integrated circuit chips which have dimensions on the order of about 1 cm. by 1 cm., and with a chipmount 10 of about 1.5 cm. by 2 cm., a volume of only about 3 cm.$^3$ is used. It can be seen that since the illustrated packaging arrangement utilizes only the chips themselves, without the conventional chip carriers, a high density package is achieved. In addition, because of the closely-spaced three dimensional nature of the micropackage, the length of the interconnecting leads are minimized, thereby reducing the transmission delays between the chips.

The microprocessor chip 14 includes a plurality of electrical connection points 20 for access to the electrical circuitry of the chip 14. Formed on the planar face 12 of the chipmount 10 are a plurality of conductive interconnections 22. The illustrated connection 22 provides electrical continuity between a solder pad 24 and the end of a conductive conduit 26 which extends downwardly and through the chipmount 10. The interconnections between connection points 20 and solder pads 24 will be provided by subsequent structure to be described with respect to FIG. 4. Other solder pads 25 and 27 provide other points of electrical connection to the pads 24. A crossover member 28 is also shown, shorting together two conductive conduits 30 and 32 on the top planar face 12. The crossover 28 allows one conductive interconnection to be routed up and over another so that the intersection of the conductive interconnections does not form a short circuit therebetween.

Figure 2:
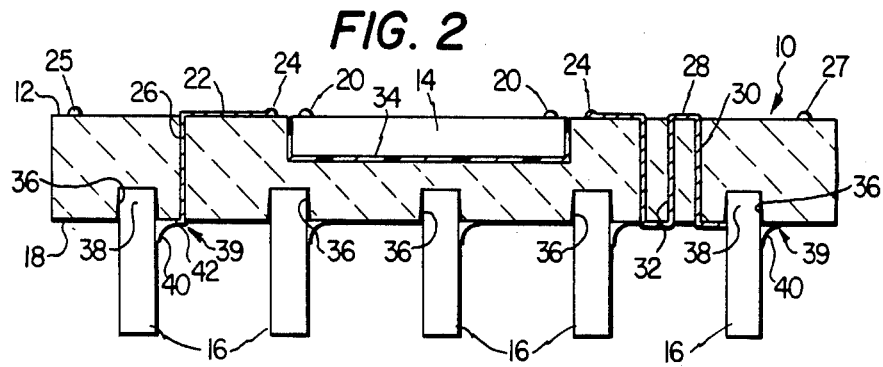
FIG. 2 is a sectional view of the micropackage, taken along line 2—2 of FIG. 1.

The micropackage is shown in more detail in FIG. 2. The chipmount 10 is fabricated with a slice of silicon semiconductor material, using conventional silicon technology. Other materials, such as graphite, ceramic or silicon carbide can be used to fabricate a chipmount according to the invention. The size of the chipmount can be as small as about 1 cm by 1 cm, or several inches in length and width to accommodate a large number of chips. For small chipmounts, a thickness of about 20-30 mils may be sufficient to provide the necessary strength. Larger chipmounts may need to be thicker.

A shallow cavity 34 is etched into the top planar face 12 of the chipmount 10. The depth of the cavity 34 is sufficient to accommodate an integrated circuit chip disposed therein. A cavity depth of 10-15 mils is sufficient to hold most integrated circuit chips. The cavity 34 can also be formed deeper and narrower for orthogonally mounting a chip to the top side of the chipmount 10. Formed in the bottom planar face 18 of the chipmount 10 are a number of parallel channels 36. The channels 36 are etched into the silicon chipmount 10 so that the edge 38 of an integrated circuit chip 16 can be inserted therein. Plural solder pads 39 are formed adjacent the channel 36 for providing electrical connections to the internal circuits of the memory chip 16. A solder fillet 40 provides the necessary electrical interface between the solder pad 39 and a corresponding contact point (not shown) on the integrated circuit chip 16. The solder fillet 40 also rigidly fixes the chip 16 orthogonally to the chipmount 10. The other orthogonally mounted integrated circuit chips are comparably fixed to the chipmount 10.

The solder pad 39 may branch out as extended electrical interconnections 42 to other chips mounted to the chipmount 10. The fabrication of such interconnections 42 will be described in more detail below. In a similar manner, the solder pad 24 on the top planar face 12 may be connected in common to other similar solder pads. In addition, the solder pad 24 associated with the microprocessor chip 14 can be connected to the solder pad 39 associated with the memory chip 16. Electrical connections may be made from the chipmount top face 12 to the bottom face 18 by the conductive conduit 26, 30 and 32. While interconnections between the top and bottom surfaces 12 and 18 of the chipmount could be accomplished by routing conductive leads around the edge of the chipmount 10, the fabrication process becomes more complicated, and the length of the interconnecting leads is increased.

Figure 3:
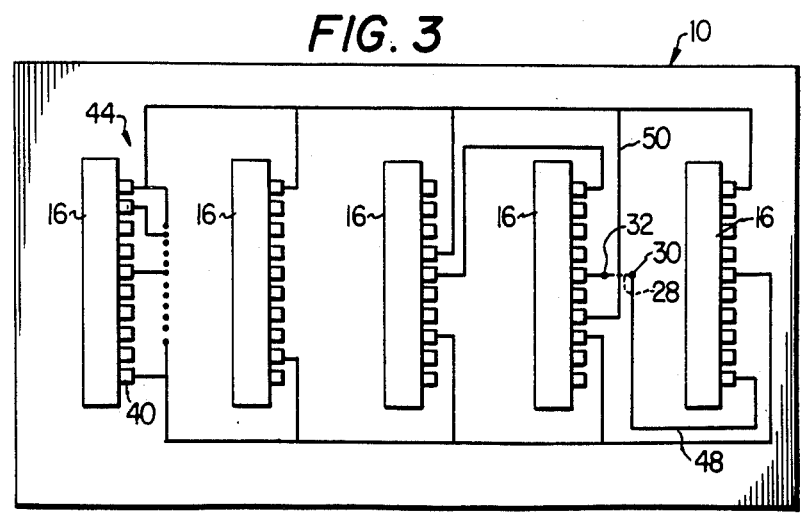
FIG. 3 is a bottom view of FIG. 2.

A bottom view of the chipmount 10 forming the micropackage is shown in FIG. 3. Shown is an arbitrary interconnection pattern 44 for providing electrical connections between the memory chips 16. The various contacts of the memory chips 16 which require a connection to the topside 12 of the chipmount 10 may be connected thereto by the conductive conduits 26. The crossover 28 (FIG. 2) and accompanying conductive conduits 30 and 32 provide a bridge of conductor 48 with respect to conductor 50. Of course, many other conductive conduits and crossovers may be utilized to provide electrical connections to the topside of the chipmount 10, as well as for nonconductive bridges of one interconnection over another. A large concentration of interconnections may thus be located in a small space. This presents a technical advantage when used with currently available integrated circuit chips where microprocessors can have up to 200 pins, and each memory can have up to 20 pins.

Figure 4:
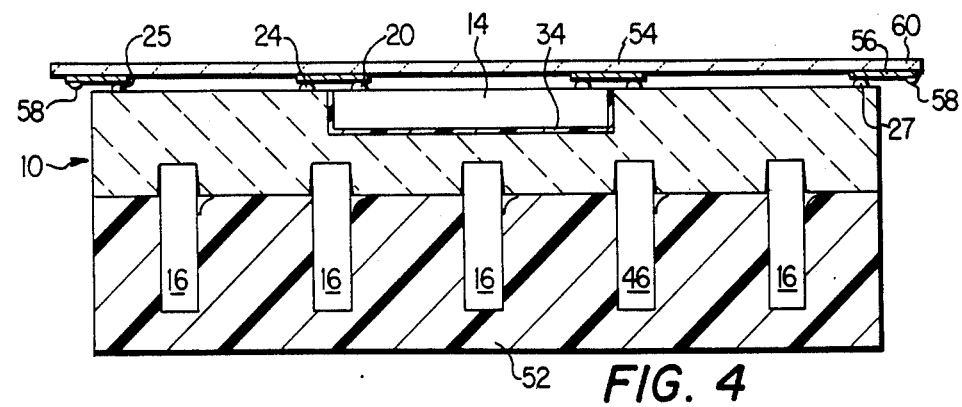
FIG. 4 is a sectional view of the micropackage similar to that of FIG. 2, but including encapsulation and a flexible connection interface.
Figure 5:
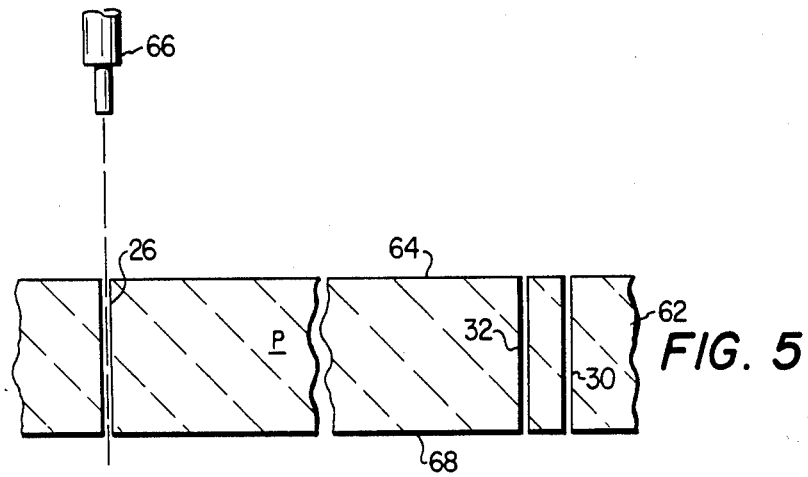
FIGS. 5-10 illustrate sectional views of a silicon micropackage during the fabrication thereof.

FIG. 4 illustrates a sectional view of a completely assembled micropackage containing plural integrated circuit chips in a three dimensional configuration. To provide a micropackage resistant to physical damage, the orthogonally mounted integrated circuit chips 16 are encapsulated in a plastic or epoxy material 52. This assures that the micropackage will not be damaged during handling thereof, such as during testing, packaging, shipping, etc. The microprocessor integrated circuit chip 14 is fixed within the shallow cavity 34 by a suitable adhesive, such as an epoxy cement. Other adhesive may be utilized, for instance, those types having high thermal conductivity characteristics.

A thin plastic or Teflon film 54 having formed thereon patterned conductive paths 56 is shown bonded to the topside chipmount solder pads and to the chip 14 itself. The conventional tape automated bonding (TAB) process is well known in the art, both as to the construction of the tape carrier 54 and the electrical bonding of the metal paths 56 thereof to the topside solder pads. Typically, the tape carrier 54 is electrically connected to the topside solder pads by screening a small deposit of solder on each pad, heating the solder to a temperature somewhat below its melting point, and then applying pressure between the tape carrier 54 and the chipmount 10. An electro-mechanical connection is thereby formed between each solder pad and its respective conductive path on the tape carrier 54. The tape carrier 54 includes additional contact pads 58 disposed under the tape carrier portion 60 extending beyond the chipmount 10. These contact pads 58 can be electrically connected to external electrical apparatus by the same bonding process described above.

From the foregoing, a highly compact micropackage has been disclosed for packaging a plurality of integrated circuit chips in a small volume. The construction of the chipmount 10 is simplified in that much of the fabrication thereof can be accomplished by standard silicon technology fabrication techniques. When used in connection with memory chips, a single 1 inch by 1 inch chipmount can accommodate a sufficient number of 256K memory chips to provide two megawords (16 bit) of storage area to a processing system. The use of 1-megabit dynamic random access memories would provide a corresponding larger storage capacity. This type of storage capacity per unit volume has not heretofore been achieved. Moreover, when the chipmount 10 is constructed of silicon, the thermal expansion and contraction characteristics of the topside integrated circuit, the chipmount and the orthogonally mounted chips are closely matched. Therefore, the expansion and contraction of the micropackage is uniform, thus minimizing thermal stresses caused by the heating and cooling of the micropackage.

The process steps for fabricating the chipmount 10 are shown in FIGS. 5-10. For purposes of clarity, the various layers of material used in masking, patterning and forming the chipmount 10 are not shown to scale. In the preferred form of the invention, the base material used in forming the chipmount 10 is comprised of an N or P-type silicon wafer 62. The wafer 62 is cut or ground so that the <110> crystal plane is oriented transverse to the top planar face 64 thereof. In the illustration, the wafer 62 is indicated as being doped with a P-type impurity. Also, the wafer 62 is cut from a column of silicon so that it is about 20-30 mils thick. Next, a conduit hole 26 is formed through the silicon wafer 62 by a laser 66. The laser 66 can be of the program-controlled type which can form small diameter conduits 26 at predetermined locations within the silicon wafer 62. Laser-formed conduits 26 of about 10 microns in diameter provide adequate passageways from the top surface 64 of the silicon wafer 62 to the bottom surface 63 thereof. Other techniques for forming the conduits 26 may be used.

Figure 6:
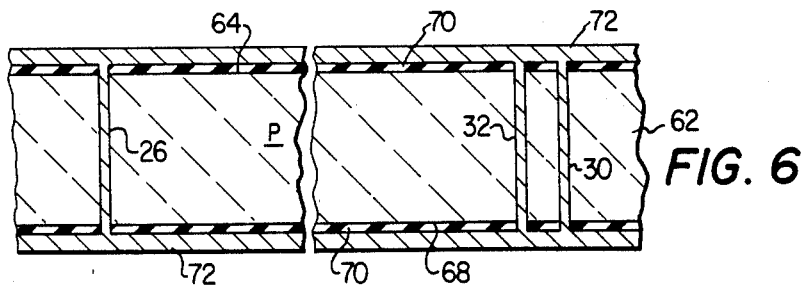

As shown in FIG. 6, a layer 70 of silicon nitride ($Si_3N_4$) is deposited on the top and bottom surfaces 64 and 68 of the silicon wafer 62. The silicon nitride functions as a mask for subsequent orientation dependent etching of the silicon wafer 62. The silicon nitride layer 70 is on the order of 2,000-3,000 angstroms thick, and deposited by conventional techniques, such as low pressure, chemical vapor deposition. The top and bottom nitride layers 70 are then patterned and etched to open the conduits 26, 30 and 32. While not shown, the silicon nitride layer 70 is conformal with respect to the conduit 26. As noted in the drawings, the silicon wafer 62 is processed on both faces 64 and 68. To do this, the wafer 62 is suspended so that both sides are exposed to the processing environment.

The silicon nitride covered wafer 62 is then subjected to a CVD process in which an appropriate conductive metal, such as tungsten, is deposited thereover. The CVD conductive metal forms an outer layer 72 covering the silicon nitride 70. The CVD material also fills the conduits 26, 30 and 32 so that a conductive conduit or feedthrough is provided from one surface 64 of the silicon wafer 62 to the opposing surface 68. Of course, the CVD material filling the conduits 26, 30 and 32 is integral with the top and bottom tungsten layer 72. The chemical vapor deposition of the metal is continued until about one micron of the metal covers the silicon nitride layer 70.

Figure 7:
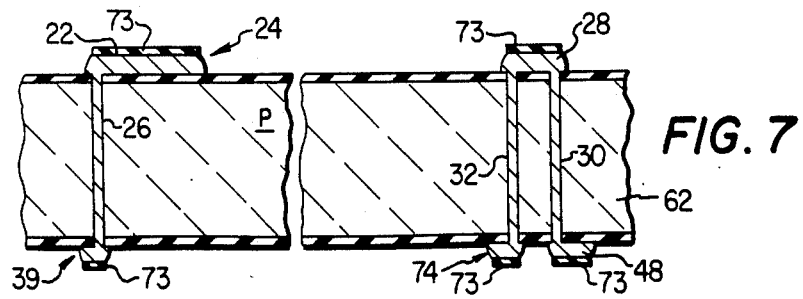

The metallization layer 72 is next patterned by a conventional mask 73 to provide the various conductive interconnections 22, the basis for the solder pads 24, 39 and 74, and the crossover 28. FIG. 7 illustrates the metallized pattern as a result of the mask 73. The mask 73 is then removed. Conductive interconnect 22 is thus formed on the top surface of the silicon wafer 62 and extends to the base of the solder pad 24. The base of the solder pad 24 is also electrically connected through the conductive conduit 26 to the base of the solder pad 39 on the bottom of the silicon wafer 62. A solder pad base 74 is comparably formed.

Figure 8:
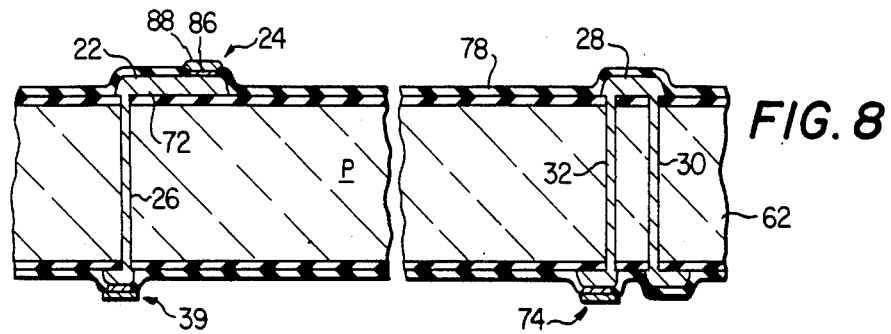

FIG. 8 illustrates the preparation of metallized silicon wafer 62 for forming the plurality of channels 36 (FIG. 2) on the bottom surface thereof, as well as the shallow cavity 34 on the top surface. An additional layer 78 of silicon nitride is deposited over the metallized pattern to provide a mask for subsequent process steps. The nitride mask layer 78 is about 4,000–6,000 angstroms thick and deposited, for example, by a compressive plasma technique. The areas at which solder pads are desired are then opened within the nitride mask layer 78. Solder pad areas 24, 39 and 74 are open by conventional techniques. Next, a layer 86 of chromium and a layer 88 of copper are sputtered or otherwise deposited over the surface of the structure, and into the openings, thereby forming solder pads 24, 39 and 74. FIG. 8 illustrates the silicon wafer 62 after the chromium and copper layers 86 and 88 have been patterned to form oversized solder pads. The chromium layer 86 is about 2,000 angstroms thick for providing a suitable bonding interface between the tungsten layer 72 and the exposed copper 88. The copper pads 88 may be about 1–2 microns thick to assure sufficient metallic mass to withstand subsequent soldering.

Figure 9:
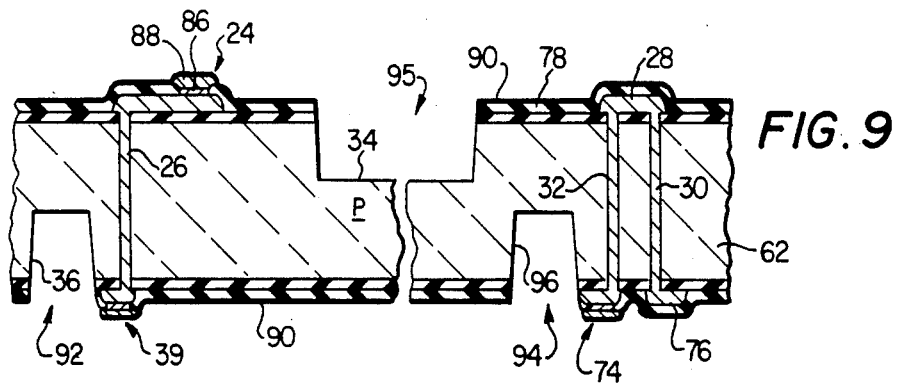

As shown in FIG. 9, an additional 2,000 angstrom chromium layer 90 is then deposited over the surface of the silicon wafer 62 to protect the underlying metallization from a subsequent chemical etch. The chromium layer 90 is patterned (not shown) and etched with a suitable solution to provide channel openings 92 and 94 on the bottom of the silicon wafer 62, as well as an opening 95 for locating the shallow cavity 34 on the top of the wafer. The chromium can be etched by a ferricyanide solution, $K_3Fe(CN)_6 + KOH + H_2O$. The silicon wafer 62 is then subjected to an orientation dependent etch to form the shallow cavity 34 and channels 36 and 96. The etch rate is a function of many variables, including time. Thus, the silicon wafer 62 is removed from the etching process when the desired depth of the shallow cavity 34 has been achieved. The surface of the shallow cavity 34 is then covered with material resistant to the silicon etch solution, and the wafer 62 is again etched until the desired depth of the channels 36 and 96 has been reached. The wafer 62 is then rinsed and cleaned. The two-part etch process can be dispensed with if it is desired to etch deep channels on the top side of the wafer 62 rather than the shallow cavity 34. With this arrangement, chips can be mounted orthogonally to both sides of the chipmount 10.

A solution suitable for etching or chemically machining the silicon wafer 62 in the <110> crystal plane can be an ethylenediamine solution. The orientation dependent etch of the channels 36 and 96 exhibit very steep elongate sidewalls, as such sidewalls are formed in alignment with the <110> silicon crystal plane. The sidewalls of the channel ends (not shown) are not so steeply disposed, as another more angled crystal plane is involved. The shallow cavity 34 is similarly shaped, having two steep sidewalls aligned with the <110> crystal plane, and two other sidewalls angled at about 35°. The large angled sidewalls of the channels 36 and 96, and those of the shallow cavity 34 are inconsequential as they are not necessary in fixing the respective integrated circuit chips therein.

After the appropriate channels and the shallow cavity have been formed in the silicon wafer 62, the mask layer 90 of chromium is removed by subjecting the slice to the ferricyanide solution. As a result, the solder pads 24, 39 and 74 are again exposed, but the underlying conductive interconnections 28 and 76 remain insulated by the silicon nitride layer 78.

Figure 10:
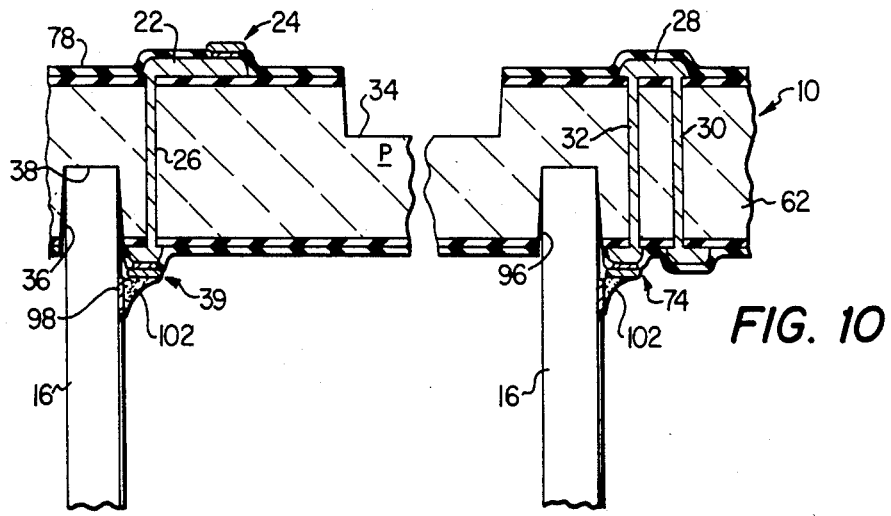

FIG. 10 is a partial enlarged view of the integrated circuit chip 16 fixed to the chipmount 10. As noted above, the solder pad 39 is connected by way of the conductive conduit 26 to the topside interconnection 22. The integrated circuit chip 16 also has formed thereon a conductive solder pad 98. The solder pad 98 is formed spaced away from the edge 38 of the chip 16 so that when it is fully inserted into the channel 36, the chip pad 98 is adjacent the solder pad 39. With this arrangement, a solder connection 102 may be formed between the chip pad 98 and the chipmount solder pad 39. The solder fillet 102 forms an electro-mechanical connection between the pads 39 and 98. In practice, many similar solder fillets are formed along the edge of the channel 36 which, together with the engagement of the chip 16 within its channel 36, provides structural rigidity to hold the chip 16 orthogonal to the chipmount 10.

The solder fillet 102 may be formed by screening a droplet of solder onto one of the pads 39 or 98, and then reflowing the solder droplet. Importantly, the solder fillet 102 provides not only the electrical connection and the physical support for the integrated circuit chip 16, but the fillet 102 also forms thermal continuity between the chip 16 and the chipmount 10. The physical engagement of the silicon chip 16 in the channel 36 of the silicon chipmount 10 provides an additional thermal path for the transfer of heat therebetween. With the chipmount 10 and the chips 14 and 16 constructed of silicon, the fabrication of the micropackage is facilitated, and the thermal compatibility of the entire unit is enhanced.

From the foregoing, a micropackaging technique has been disclosed. According to the principles and concepts of the invention, a three-dimensional packaging technique is provided which allows integrated circuit chips to be mounted on both sides of a chipmount. In the preferred form of the invention, the chips and the chipmount are both constructed of silicon. This provides the technical advantage of very short conductive paths between the integrated circuit chips mounted to both sides of the chipmount. Very short conductive paths between the opposing faces of the chipmount are provided by conductive conduits formed from one face of the chipmount to another. The conductive conduits are formed at such locations through the chipmount as to minimize lead length. The most direct route from contact pad of one integrated circuit chip to that of another is thereby provided. The conductive conduits also form interconnections between the opposing faces of the chipmount for forming crossovers insulating intersecting conductive paths. The chipmount of the invention is highly advantageous for orthogonally mounting plural high speed memory chips in channels on the bottom surface thereof, and a microprocessor integrated circuit chip in a shallow cavity on the top surface thereof. The foregoing interconnections make possible the short conductive path between the microprocessor and the associated memory. A flexible Mylar carrier strip with conductive paths can be electrically bonded to topside chipmount solder pads and also to the microprocessor solder pads. The flexible strip provides the input/output connections for accessing the micropackaged circuits.

While the principles and concepts of the invention have been set forth above, it is to be understood that such a structure and method of fabrication are not limited by this disclosure. For example, while the chipmount material and process steps have been described in connection with the preferred embodiment, the invention can be constructed with other materials and by other process steps. Indeed, some of the foregoing steps can be conducted in other sequences, changed or even eliminated. Therefore, while the preferred embodiment of the invention has been disclosed with reference to a specific chipmount structure, it is to be understood that many changes in detail may be made as a matter of engineering choice without departing from the scope of the invention as defined by the appended claims.

I claim:

1. High density packaging apparatus for mounting a plurality of integrated circuit chips thereto, comprising:
   a chipmount having a plurality of channels on one face thereof for holding a corresponding plurality of integrated circuit chips, and a cavity on another face of said chipmount for holding an integrated circuit chip; and
   a plurality of interconnections for electrically connecting the plurality of integrated circuit chips mounted on said one face to one another, and for electrically connecting the plurality of integrated circuit chips on said one face with the integrated circuit chip mounted on said another face.

2. The packaging apparatus of claim 1 wherein said interconnections comprise conductive paths formed in said chipmount.

3. The packaging apparatus of claim 2 wherein said conductive paths include metallized conduits extending through said chipmount from said one face to said another face.

4. The packaging apparatus of claim 1 wherein each said channel is dimensioned to accommodate an edge of an integrated circuit chip so that the chip inserted therein is mounted generally orthogonal to said chipmount, and wherein said cavity is dimensioned for accepting an integrated circuit chip so that the chip is generally coplanar with said chipmount.

5. The packaging apparatus of claim 1 further including a plurality of solder pads formed along each said channel for providing a solder connection to an integrated circuit inserted within said channel, each said solder pad being electrically connected to at least one of said interconnections, and further including a plurality of solder pads adjacent said cavity for providing electrical connections to an integrated circuit disposed within said cavity.

6. The packaging apparatus of claim 5 further including a flexible strip having a plurality of conductive paths for bonding to said solder pads adjacent said cavity and for bonding to the integrated circuit chip disposed therein.

7. The packaging apparatus of claim 1 wherein a chip is fixed in each said channel by a solder connection, and an integrated circuit chip is fixed in said cavity by an adhesive.

8. The packaging apparatus of claim 1 further including in combination a microprocessor chip fixed in said cavity and connectable by said interconnections to a plurality of semiconductors memory chips fixed within respective said channels.

9. The packaging apparatus of claim 1 wherein said chipmount is constructed of silicon.

10. The packaging apparatus of claim 1 wherein the area of said one face is less than three centimeters squared.

11. A high density microprocessor and memory package, comprising:
    a microprocessor integrated circuit chip having a plurality of electrical contacts for providing access to the circuitry of a microprocessor in said chip.
    a plurality of memory integrated circuit chips, each having a plurality of electrical contacts for providing access to the circuitry of the memory cells in each said memory chip;
    a chipmount having a planar top and bottom face and including means for mounting said memory chips orthogonally to said chipmount on the bottom face thereof, and further including means for mounting said microprocessor chip to the top face thereof; and
    a plurality of interconnections for connecting the contacts of said microprocessor to the contacts of said memory chips.

12. The high density microprocessor and memory package of claim 11 wherein said chipmount is constructed of silicon.

13. The high density microprocessor and memory package of claim 11 further including a plurality of conductive paths formed through said chipmount from said top face to said bottom face.

14. The high density microprocessor and memory package of claim 11 wherein said top planar face includes a cavity for holding therein said microprocessor chip, and said bottom face includes a plurality of channels in which an edge of a respective said memory chip is partially inserted.

15. The high density microprocessor and memory package of claim 11 further including an encapsulant enclosing at least a portion of said memory chips.

16. The high density microprocessor and memory package of claim 11 further including a flexible strip having conductive paths for connecting to said microprocessor contacts and to said interconnections to provide external access to said microprocessor chip.

17. A circuit module, comprising:
    a planar silicon chipmount having a first face and an opposing second face, a shallow cavity formed in said first face and a plurality of parallel channels formed in said second face;
    a plurality of contact pads adjacent said cavity;
    a plurality of contact pads adjacent each said channel;
    a plurality of conductive conduits formed in said chipmount extending from said first face to said second face;
    a plurality of interconnections integral with said chipmount connecting ones of said contact pads adjacent said channels to ones of said conductive conduits, and a plurality of interconnections integral with said chipmount connecting ones of said contact pads adjacent said cavity to desired ones of said conductive conduits;

a first plurality of integrated circuit chips mounted at their edges in said channels;

means for electrically connecting each said integrated circuit chip to said contact pad adjacent thereto; and a second integrated circuit chip mounted in said cavity.

18. The circuit module of claim 17 further including means for electrically connecting contact pads adjacent said cavity to said second chip.

19. The circuit module of claim 18 further including an encapsulant encasing said first plurality of chips.

* * * * *